United States Patent
Gao et al.

(10) Patent No.: US 10,504,974 B2
(45) Date of Patent: Dec. 10, 2019

(54) ORGANIC ELECTROLUMINESCENT ARRAY SUBSTRATE AND DISPLAY DEVICE FOR CONTROLLING VOLUME RESISTIVITY OF PIXEL DEFINITION LAYER

(71) Applicants: BOE TECHNOLOGY GROUP CO., LTD., Beijing (CN); HEFEI BOE OPTOELECTRONICS TECHNOLOGY CO., LTD., Hefei, Anhui (CN)

(72) Inventors: Zhiyang Gao, Beijing (CN); Zhaozhe Xu, Beijing (CN); Xianjie Shao, Beijing (CN); Yuanyang Zhao, Beijing (CN); Mengke Zhao, Beijing (CN)

(73) Assignees: BOE TECHNOLOGY GROUP CO., LTD., Beijing (CN); HEFEI BOE OPTOELECTRONICS TECHNOLOGY CO., LTD., Heifei (CN)

( * ) Notice: Subject to any disclaimer, the term of this patent is extended or adjusted under 35 U.S.C. 154(b) by 0 days.

(21) Appl. No.: 15/848,702

(22) Filed: Dec. 20, 2017

(65) Prior Publication Data
US 2018/0342562 A1 Nov. 29, 2018

(30) Foreign Application Priority Data
May 24, 2017 (CN) .......................... 2017 1 0381703

(51) Int. Cl.
*H01L 27/32* (2006.01)
(52) U.S. Cl.
CPC ...... *H01L 27/3246* (2013.01); *H01L 27/3262* (2013.01); *H01L 27/3276* (2013.01); *H01L 2251/5369* (2013.01); *H01L 2251/55* (2013.01)

(58) Field of Classification Search
CPC ....................... H01L 27/3246; H01L 27/3262
See application file for complete search history.

(56) References Cited

U.S. PATENT DOCUMENTS

| 7,273,661 B2 * | 9/2007 | Moriyama | B82Y 10/00 427/372.2 |
| 2012/0228602 A1 * | 9/2012 | Nakatani | H01L 51/5088 257/40 |
| 2016/0238918 A1 * | 8/2016 | Nakashima | G02F 1/167 |

FOREIGN PATENT DOCUMENTS

| CN | 105892191 A | 8/2016 |
| WO | WO-2017/069501 A1 | 4/2017 |

OTHER PUBLICATIONS

First Office Action for CN Appl. No. 201710381703.7, dated Apr. 18, 2019.

* cited by examiner

*Primary Examiner* — Quoc D Hoang
(74) *Attorney, Agent, or Firm* — Foley & Lardner LLP; James F. Ewing; Paul M. H. Pua

(57) ABSTRACT

The present disclosure provides an organic electroluminescent array substrate and a display device comprising the organic electroluminescent array substrate. The organic electroluminescent array substrate comprises: a pixel array, in which each pixel has a light-emitting region; and a pixel definition layer for defining the light-emitting region of each pixel, wherein the pixel definition layer has a volume resistivity of $10^7$ to $10^{10}$ Ω·m.

12 Claims, 4 Drawing Sheets

ORGANIC ELECTROLUMINESCENT ARRAY SUBSTRATE AND DISPLAY DEVICE FOR CONTROLLING VOLUME RESISTIVITY OF PIXEL DEFINITION LAYER

CROSS REFERENCE TO RELATED APPLICATION

This application claims priority to Chinese Patent Application No. 201710381703.7 filed on May 24, 2017, the disclosure of which is incorporated herein in its entirety by reference.

TECHNICAL FIELD

The present disclosure relates to an organic electroluminescent array substrate and a display device comprising the organic electroluminescent array substrate.

BACKGROUND

An organic electroluminescent device (OLED) is concerned by the industry due to its self-luminescence, low driving voltage, rapid response, wide viewing angle and so on. An organic electroluminescent array panel mainly comprises a thin-film transistor (TFT) driving circuit layer, an anode layer, a pixel definition layer, an organic material layer and a cathode layer, wherein the TFT driving circuit layer at least comprises two signal lines, i.e., a first metal line and a second metal line, and the anode layer domain and the pixel definition region cover the first and second metal lines. The cathode layer covers the entire anode layer domain and the pixel definition region and has an area overlapping with the first and second metal lines, which results in parasitic capacity.

SUMMARY

In one aspect of the present disclosure, an organic electroluminescent array substrate is provided, which comprises: a pixel array, in which each pixel has a light-emitting region; and a pixel definition layer for defining the light-emitting region of each pixel, wherein the pixel definition layer has a volume resistivity of $10^7$ to $10^{10}$ $\Omega \cdot m$.

According to an exemplary embodiment of the present disclosure, the pixel definition layer has a volume resistivity of $10^7$ to $10^{10}$ $\Omega \cdot m$.

According to an exemplary embodiment of the present disclosure, the pixel definition layer is formed by a polyimide material or an acrylic material doped with an electrically conductive material.

According to an exemplary embodiment of the present disclosure, the electrically conductive material is selected from a metal, an electrically conductive metal oxide, an electrically conductive polymer or any mixture thereof.

According to an exemplary embodiment of the present disclosure, the electrically conductive material is an electrically conductive nanomaterial.

According to an exemplary embodiment of the present disclosure, the electrically conductive nanomaterial is selected from an electrically conductive nanowire, an electrically conductive nanotube, an electrically conductive nanoparticle or any mixture thereof.

According to an exemplary embodiment of the present disclosure, the electrically conductive nanoparticle has a diameter equal to or less than 100 nm.

According to an exemplary embodiment of the present disclosure, the electrically conductive nanowire has a length equal to or less than 100 nm, and the electrically conductive nanowire has a diameter equal to or less than ½ of the length.

According to an exemplary embodiment of the present disclosure, a volume ratio of the electrically conductive material to the polyimide material is 1:1000 to 1:20.

In one aspect of the present disclosure, a display device is provided, which comprises the organic electroluminescent array substrate as mentioned above.

BRIEF DESCRIPTION OF THE DRAWINGS

In order to more clearly illustrate the embodiments of the present disclosure, a brief introduction will be given below for the drawings necessary to be used in the description of the embodiments. It is obvious that, the drawings illustrated below are merely exemplary embodiments of the present disclosure. For a person skilled in the art, he or she may also acquire other drawings according to such drawings without inventive efforts.

DETAILED DESCRIPTION

Figure 1:
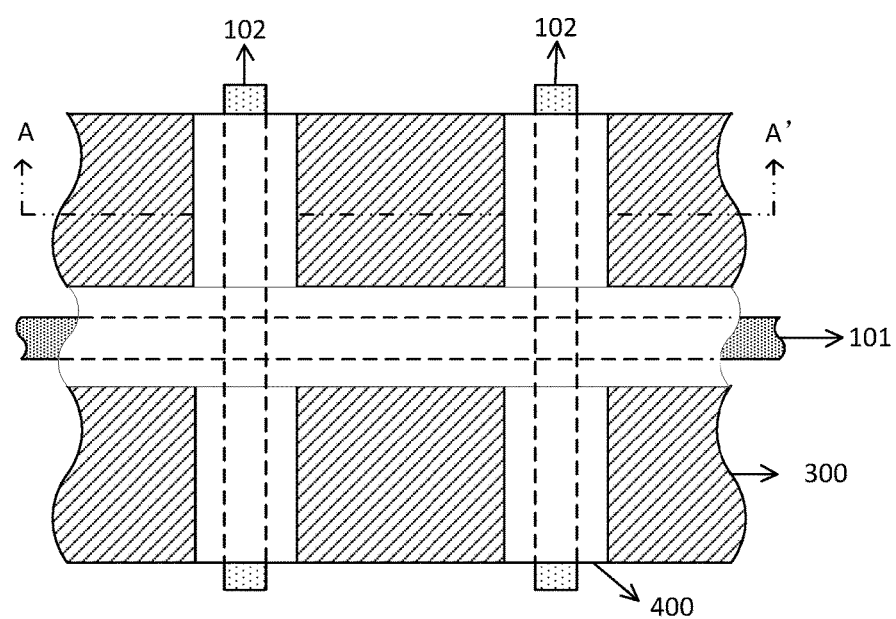
FIG. 1 is a schematic top view of an organic electroluminescent array panel according to a comparative example of the present disclosure, wherein the pixel definition layer is formed by a polyimide material.

The technical solutions in the examples of the present disclosure are described below in combination with the examples of the present disclosure in a clear and complete manner. Apparently, the embodiments and/or examples as described are only a portion rather than all of the embodiments and/or examples of the present disclosure. All of other embodiments and/or examples that are obtainable to those skilled in the art based on the embodiments and/or examples of the present disclosure without inventive efforts are included in the protection scope of the present disclosure.

In the present disclosure, unless particularly indicated, the ratios, contents, portions and the like are based on weight. In addition, in the present disclosure, a layer and a film can be used in an interchangeable manner. The terms "first" and "second" are used only for the purpose of description, but shall not be understood as an indication or suggestion of relative importance or an implication of the number of the technical features as indicated. Hence, the feature defined with "first", "second" or "third" may include, explicitly or implicitly, one or more of the features.

An organic electroluminescent array panel mainly comprises a TFT driving circuit layer, an anode layer, a pixel definition layer, an organic material layer and a cathode layer, wherein the TFT driving circuit layer at least comprises two signal lines, i.e., a first metal line and a second metal line, and the anode layer domain and the pixel definition region cover the first and second metal lines. The cathode layer covers the entire anode layer domain and the pixel definition region and has an area overlapping with the first and second metal lines, which results in parasitic capacity.

The pixel definition layer is generally made of a polyimide material or an acrylic material, with a volume resistivity of $10^{14}$ to $10^{15}$ Ω·m. When the first metal line and/or the second metal line have a sudden change of voltage, due to the impact of the parasitic capacity, the surrounding cathode potential changes along with it, resulting in poor crosstalk.

The inventors of the present disclosure found that, by making a volume resistivity of the pixel definition layer between $10^7$ and $10^{10}$ Ω·m, the coupling capacitance between the metal lines in the cathode layer and the driving circuit layer can be effectively reduced, and when there is a sudden change of voltage on the first metal line and/or the second metal line, the change of surrounding cathode voltage is small, thereby reducing the crosstalk.

In one aspect of the present disclosure, an organic electroluminescent array substrate is provided, which comprises: a pixel array, in which each pixel has a light-emitting region; and a pixel definition layer for defining the light-emitting region of each pixel, wherein the pixel definition layer has a volume resistivity of $10^7$ to $10^{10}$ Ω·m. For example, the pixel definition layer has a volume resistivity of $10^7$ to $5\times10^9$ Ω·m, $10^7$ to $10^9$ Ω·m, $10^7$ to $5\times10^8$ Ω·m, $10^7$ to $3\times10^8$ Ω·m, or $10^7$ to $10^8$ Ω·m.

An excessively low resistivity, for example, less than or equal to $10^6$ Ω·m, would result in short circuiting between anodes of adjacent pixels, while an excessively high resistivity, for example, higher than or equal to $10^{11}$ Ω·m, would not effectively reduce the coupling capacitance.

By making a volume resistivity of the pixel definition layer between $10^7$ and $10^{10}$ Ω·m, the coupling capacitance between the metal lines in the cathode layer and the driving circuit layer can be effectively reduced, and when there is a sudden change of voltage on the first metal line and/or the second metal line, the change of surrounding cathode voltage is small, thereby reducing the crosstalk.

According to an exemplary embodiment of the present disclosure, the pixel definition layer may be formed by a polyimide material or an acrylic material doped with an electrically conductive material, for example, a polyimide material doped with an electrically conductive material.

According to an exemplary embodiment of the present disclosure, the electrically conductive material may be selected from a metal, an electrically conductive metal oxide, an electrically conductive polymer or any mixture thereof. For example, the electrically conductive material may be an electrically conductive nanomaterial.

According to an exemplary embodiment of the present disclosure, the electrically conductive material may be selected from an electrically conductive nanowire, an electrically conductive nanotube, an electrically conductive nanoparticle or any mixture thereof.

According to an exemplary embodiment of the present disclosure, the electrically conductive nanomaterial may be selected from a metal nanoparticle, a carbon nanoparticle, a metal nanotube, a carbon nanotube, a metal oxide nanoparticle or any mixture thereof. For example, the metal oxide nanoparticle may be selected from a titanium dioxide nanoparticle, a zinc oxide nanoparticle, an indium oxide nanoparticle, an indium-tin oxide nanoparticle, a zinc-tin oxide nanoparticle or any mixture thereof. The metal in the metal nanoparticle may be selected from gold, silver, copper, aluminum, platinum or any mixture or alloys thereof. For example, the metal nanoparticle may be a silver nanoparticle.

According to an exemplary embodiment of the present disclosure, the electrically conductive nanoparticle may have a particle diameter equal to or less than 100 nm, for example, equal to or less than 90 nm, equal to or less than 80 nm, equal to or less than 70 nm, equal to or less than 60 nm, or equal to or less than 50 nm. There is no particular limitation on the lower limit of the particle diameter of the electrically conductive nanoparticle, which may be a minimum particle diameter obtainable on market.

According to an exemplary embodiment of the present disclosure, the electrically conductive nanowire may have a length equal to or less than 100 nm, for example, equal to or less than 90 nm, equal to or less than 80 nm, equal to or less than 70 nm, equal to or less than 60 nm, or equal to or less than 50 nm. There is no particular limitation on the lower limit of the length of the electrically conductive nanowire, which may be a minimum length obtainable on market. In addition, the electrically conductive nanowire may have a diameter equal to or less than ½ of the length, for example, equal to or less than ¼ of the length, equal to or less than ⅕ of the length, or equal to or less than 1/10 of the length. According to an exemplary embodiment of the present disclosure, the electrically conductive nanowire may have a diameter greater than or equal to 1/100 of the length, or greater than or equal to 1/50 of the length.

According to an exemplary embodiment of the present disclosure, the electrically conductive polymer may be selected from poly(3,4-ethylenedioxythiophene), 3,4-ethylenedioxythiophene, polystyrene sulfonic acid, polyaniline, polythiophene, polyacetylene, polypyrrole or any mixture thereof.

According to an exemplary embodiment of the present disclosure, in the pixel definition layer, a volume ratio of the electrically conductive material to the polyimide material may be 1:1000 to 1:20, for example, 1:500 to 1:25, or 1:200 to 1:50.

According to an exemplary embodiment of the present disclosure, a ratio of the maximum size of the electrically conductive nanomaterial to the thickness of the pixel definition layer may be equal to or less than 0.2, for example, equal to or less than 0.1, or equal to or less than 0.05. For the present disclosure, in a case where the electrically conductive nanomaterial is an electrically conductive nanowire, the maximum size of the electrically conductive nanomaterial refers to a length of the electrically conductive nanowire; in a case where the electrically conductive nanomaterial is an electrically conductive nanoparticle, the maximum size of the electrically conductive nanomaterial refers to a particle diameter of the electrically conductive nanoparticle; and in a case where the electrically conductive material is an electrically conductive nanotube, the maximum size of the electrically conductive nanomaterial refers to the larger one of a diameter and a height of the electrically conductive nanotube.

According to an exemplary embodiment of the present disclosure, the organic electroluminescent array substrate may comprise, in sequence, a thin-film transistor driving circuit layer, an anode layer, the pixel definition layer, an organic material layer and a cathode layer, wherein the thin-film transistor driving circuit layer at least comprises a first metal line and a second metal line which intersect with each other, wherein the pixel definition layer covers the first metal line and the second metal line, the cathode layer covers the organic material layer, the anode layer and the pixel definition layer, and has an area overlapping with both the first metal line and the second metal line.

In one aspect of the present disclosure, an organic electroluminescent panel may be provided, which comprises the organic electroluminescent array substrate as mentioned above.

In one aspect of the present disclosure, a display device may be provided, which comprises the organic electroluminescent array substrate as mentioned above.

For example, the organic electroluminescent panel may comprise the organic electroluminescent array substrate as mentioned above, a color film substrate in an opposite-box arrangement relative to the organic electroluminescent array substrate, and a liquid crystal layer positioned between the organic electroluminescent array substrate and the color film substrate.

According to an exemplary embodiment of the present disclosure, the display device may be any product or component with a display function, such as a liquid crystal panel, electronic paper, an organic electroluminescent panel, a mobile phone, a tablet computer, a television set, a display, a notebook computer, a digital photo frame, a navigator and so on.

According to an exemplary embodiment of the present disclosure, the organic electroluminescent array substrate may be a bottom emitting type or a top emitting type of the organic electroluminescent array substrate, depending on its light-emitting manner.

The volume resistivity of a monomer material and a mixed material may be measured by a device having a structure of an electrode/a material to be measured/an electrode, and an area and a thickness of the material to be measured may be adjusted according to practical process conditions.

The use of an organic electroluminescent panel according to the present disclosure can obviously improve crosstalk of the organic electroluminescent panel, i.e., the brightness of the pixel would not be influenced at all by brightness of surrounding pixels.

The parasitic capacity C may be calculated according to the formula $C=\varepsilon \times s/d$, wherein $\varepsilon$ is a dielectric constant of an organic material (such as a pixel definition layer), s is an area between two electrodes, and d is a thickness of the organic material. By doping an electrically conductive material in the pixel definition layer, $\varepsilon$ can be effectively reduced, thereby effectively reducing the parasitic capacity.

Figure 2:
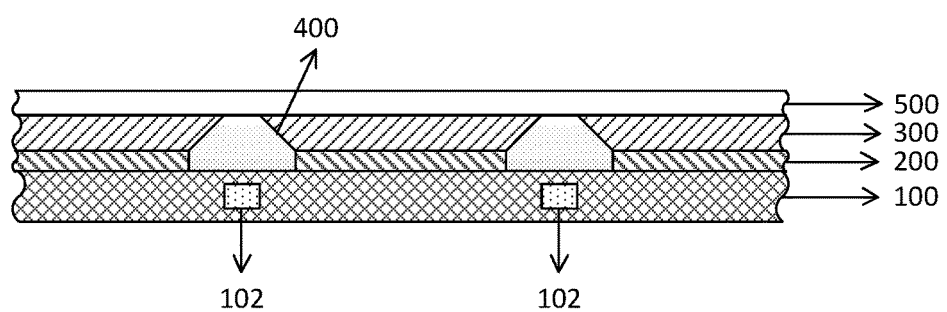
FIG. 2 is a schematic sectional view of an organic electroluminescent array panel according to a comparative example of the present disclosure along a line A-A' as shown in FIG. 1, wherein the pixel definition layer is formed by a polyimide material.

FIG. 1 is a schematic top view of an organic electroluminescent array panel according to a comparative example of the present disclosure, wherein the pixel definition layer is formed by a polyimide material. FIG. 2 is a schematic sectional view of an organic electroluminescent array panel according to a comparative example of the present disclosure along a line A-A' as shown in FIG. 1, wherein the pixel definition layer is formed by a polyimide material.

The organic electroluminescent array substrate as shown in FIGS. 1 and 2 may comprise, in sequence, a thin-film transistor driving circuit layer 100, an anode layer 200, a pixel definition layer 400, an organic material layer 300 and a cathode layer 500 (which is transparent and not shown in FIG. 1), wherein the thin-film transistor driving circuit layer 100 at least comprises a first metal line 101 and a second metal line 102 which intersect with each other, wherein the pixel definition layer 400 covers the first metal line 101 and the second metal line 102, the cathode layer 500 covers the organic material layer 300, the anode layer 200 and the pixel definition layer 400, and has an area overlapping with both the first metal line 101 and the second metal line 102, thereby resulting in a parasitic capacity. The pixel definition layer 400 is generally made of a polyimide material or an acrylic material, with a volume resistivity of generally $10^{14}$ to $10^{15}$ Ω·m; when the first metal line 101 and/or the second metal line 102 have a sudden change of voltage, the parasitic capacity is relatively great, and due to the impact of the parasitic capacity, the surrounding cathode potential changes along with it, resulting in poor crosstalk.

Figure 3:
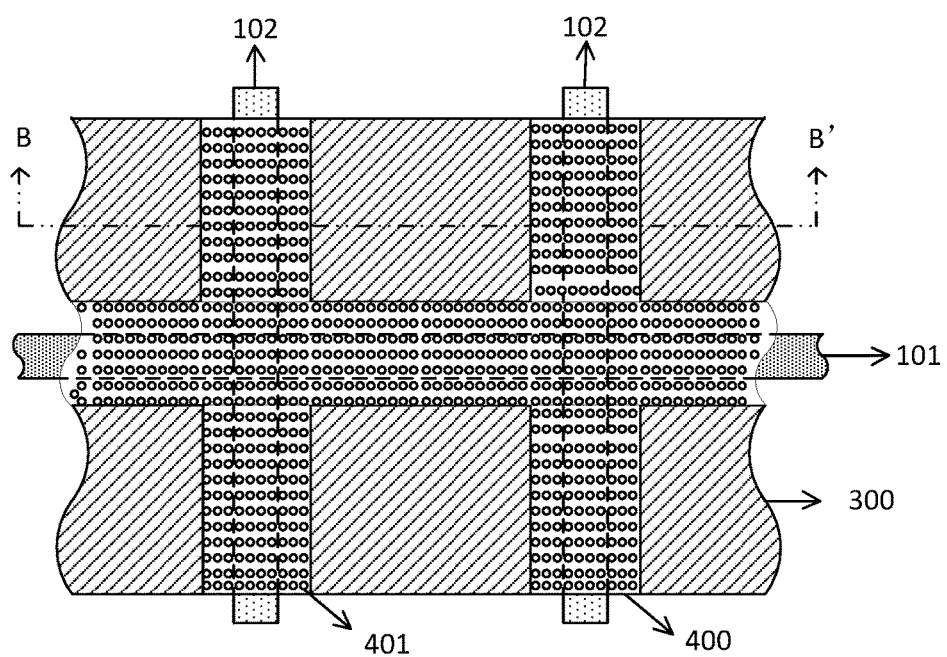
FIG. 3 is a top schematic view of an organic electroluminescent array panel according to an example of the present disclosure, wherein the pixel definition layer is formed by a polyimide material doped with electrically conductive nanoparticles.
Figure 4:
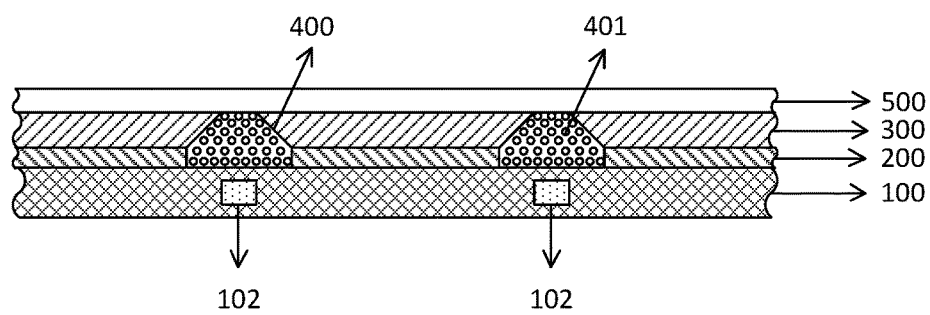
FIG. 4 is a schematic sectional view of an organic electroluminescent array panel according to an example of the present disclosure along a line B-B' as shown in FIG. 3, wherein the pixel definition layer is formed by a polyimide material doped with electrically conductive nanoparticles.

FIG. 3 is a schematic top view of an organic electroluminescent array panel according to an example of the present disclosure, wherein the pixel definition layer is formed by a polyimide material doped with electrically conductive nanoparticles. FIG. 4 is a schematic sectional view of an organic electroluminescent array panel according to an example of the present disclosure along a line B-B' as shown in FIG. 3, wherein the pixel definition layer is formed by a polyimide material doped with electrically conductive nanoparticles.

The organic electroluminescent array substrate as shown in FIGS. 3 and 4 differs from the organic electroluminescent array substrate as shown in FIGS. 1 and 2 in that, in the organic electroluminescent array substrate as shown in FIGS. 3 and 4, an electrically conductive material (such as an electrically conductive nanoparticle 401) is doped into the pixel definition layer 400, and the film-forming developing process for the doped polyimide material or acrylic material is the same as that for the material before doping, without any additional process steps. By adjusting the ratio of the doping, the volume resistivity of the pixel definition layer 400 is controlled to be $10^7$ to $10^{10}$ Ω·m. The doped pixel definition layer 400 can effectively reduce the parasitic capacity and reduce crosstalk. The cathode layer 500 is transparent and not shown in FIG. 3.

By providing the organic electroluminescent array substrate, the pixel definition layer 400 has a volume resistivity between $10^7$ and $10^{10}$ Ω·m, which can effectively reduce the coupling capacitance between the first metal line 101 and/or the second metal line 102 in the cathode layer 500 and the thin-film transistor driving circuit layer 100. When there is a sudden change of voltage on the first metal line 101 and/or the second metal line 102, the change of surrounding cathode voltage is small, thereby reducing the crosstalk.

In the following exemplary embodiments, unless particularly indicated, the portions and ratios are based on weight. The embodiments are for the purpose of illustration, but shall not be regarded as limitations on the scope of the present disclosure.

The materials used in the exemplary embodiments are as follows:

Polyimide solution: a weight-average molecular weight of the polyimide is 75000 g/mol.

Electrically conductive nanoparticles: silver nanoparticles having an average particle diameter of 50 nm.

In a driving array substrate (TFT driving panel) including a TFT driving circuit layer, the TFT driving panel comprises, in sequence, a polysilicon layer (300 nm), a first silicon oxide/silicon nitride insulating layer (400 nm), a first Al/Ti metal layer (250 nm), a second silicon oxide/silicon nitride insulating layer (400 nm), a second Al/Ti metal layer (250 nm), an acrylic organic film layer (2 μm), a first transparent electrically conductive layer (ITO) (350 nm), a third silicon oxide/silicon nitride insulating layer (300 nm) and a second transparent electrically conductive layer (ITO) (350 nm), wherein the dielectric constant of each respective insulating layer is 8 F/m, having the following specifications:

Resolution: 80 PPI

Effective display area (AA area) size: 10053.12 μm*10053.12 μm

Pixel number in the AA area: 32*32

Pixel size: 314.16 μm*314.16 μm

Opening rate: 32.83%

Ink: Livilux® ink commercially purchased from Merck Company.

In some exemplary embodiments, the electrically conductive nanoparticles are not doped or doped into the polyimide, such that in the final polyimide thin film, a volume ratio of the electrically conductive nanoparticles to the polyimide is selected from 0, 1:10000, 1:500, 1:50 and 1:5, respectively. The non-doped or doped polyimide thin film is coated onto a peelable substrate, such that a thickness of the film is 1.5 μm after drying. A polyimide thin film is obtained by peeling.

The volume resistivity of the obtained polyimide thin film may be measured by a device having a structure of an electrode/a polyimide thin film/an electrode.

As a result, in the resulting polyimide thin film, a volume ratio of the electrically conductive nanoparticles to the polyimide is 0, 1:10000, 1:500, 1:50 and 1:5, respectively, and the magnitude of the volume resistivity of the polyimide thin film is $10^{14}$ Ω·m, $10^{13}$ Ω·m, $10^{10}$ Ω·m, $10^{8}$ Ω·m and $10^{6}$ Ω·m, respectively.

In some exemplary embodiments, the electrically conductive nanoparticles are doped into the polyimide, such that in the final polyimide thin film, a volume ratio of the electrically conductive nanoparticles to the polyimide is selected from 1:10000, 1:500, 1:50 and 1:5, respectively. The doped polyimide solution is coated onto a driving array substrate comprising a TFT driving circuit layer, such that a thickness thereof is 1.5 μm after drying. A corresponding pattern is developed after exposing, that is, a light-emitting region of the pixel. The polyimide thin film defines the light-emitting region of each pixel.

An ink jet printer is used to print ink for a cavity injection layer among the Livilux® series ink in the light-emitting region, such that the coated film for the cavity injection layer has a film thickness of 55 nm. The printed substrate is subjected to vacuum drying and baked for film forming, thereby forming the cavity injection layer.

Subsequently, on the cavity injection layer, the ink jet printer is used to print ink for a cavity transfer layer among the Livilux® series ink, such that the coated film for the cavity transfer layer has a film thickness of 130 nm. The printed substrate is subjected to vacuum drying and baked for film forming, thereby forming the cavity transfer layer.

Next, on the cavity transfer layer, the ink jet printer is used to print ink for a light-emitting layer among the Livilux® series ink, such that the coated film for the light-emitting layer has a film thickness of 40 nm. The printed substrate is subjected to vacuum drying and baked for film forming, thereby forming the light-emitting layer.

Then, on an evaporator platform, lithium fluoride and aluminum are evaporated respectively to serve as electrodes, wherein the lithium fluoride has a thickness of 1 nm, and the aluminum has a thickness of 100 nm, thereby obtaining an organic electroluminescent array substrate.

After obtaining the organic electroluminescent array substrate, professionals for evaluating crosstalk levels of an organic electroluminescent array substrate, non-professionals and clients evaluate the crosstalk level according to whether a crosstalk occurs in a crosstalk picture and the extent of the crosstalk, i.e., the organic electroluminescent array substrate is switched to a crosstalk picture, and the picture is directly observed and determined by human eyes to obtain a crosstalk level of the organic electroluminescent array substrate. The crosstalk picture is generally as follows: the zero grey scale is displayed in the middle and the highest grey scale is displayed in the periphery; or, the highest grey scale is displayed in the middle and the zero grey scale is displayed in the periphery.

The crosstalk level of the organic electroluminescent array substrate may be determined and assessed according to the following criteria:

Greater than or equal to a fourth level (level 4): non-professionals can easily see that a crosstalk occurs in the crosstalk picture, and 100% of clients do not accept;

A third level (level 3): non-professionals can hardly see that a crosstalk occurs in the crosstalk picture, professionals can easily see the crosstalk picture, and more than 80% of clients do not accept;

A second level (level 2): some professionals can see that a crosstalk occurs in the crosstalk picture, and more than 20% of clients do not accept;

A first level (level 1): professionals can hardly see that a crosstalk occurs in the crosstalk picture, and 100% of clients accept; and Half level (level 0.5): professionals cannot see that a crosstalk occurs in the crosstalk picture, and 100% of clients accept.

Among the obtained organic electroluminescent array substrates, the organic electroluminescent array substrates in which a volume ratio of the electrically conductive nanoparticles to the polyimide is 1:10000, 1:500, 1:50 and 1:5, respectively, have crosstalk levels of the fourth level (Level 4), the second level (Level 2), the half level (Level 0.5) and abnormal display, respectively, wherein the organic electroluminescent array substrates having the crosstalk levels greater than Level 2 (such as Level 3 or Level 4) are unqualified, while the organic electroluminescent array substrates having the crosstalk levels equal to or lower than Level 2 (such as Level 2, Level 1 or Level 0.5) are qualified.

Thus, according to the above embodiments, by providing the organic electroluminescent array substrate, in which the pixel definition layer has a volume resistivity between $10^7$ and $10^{10}$ Ω·m, the coupling capacitance between the first metal line and/or the second metal line in the cathode layer and the thin-film transistor driving circuit layer can be effectively reduced, and when there is a sudden change of voltage on the first metal line and/or the second metal line, the change of surrounding cathode voltage is small, thereby reducing the crosstalk.

It will be apparent to those skilled in the art that various modifications and variations can be made to the embodiments of the present disclosure without departing from the spirit and scope of the present disclosure. In this case, if the modifications and variations made to the present disclosure fall within the scope of the claims of the present disclosure and equivalents thereof, the present disclosure is intended to include these modifications and variations.

What is claimed is:

1. An organic electroluminescent array substrate, comprising:
    a pixel array, in which each pixel has a light-emitting region; and
    a pixel definition layer for defining the light-emitting region of each pixel,
    wherein the pixel definition layer has a volume resistivity which is higher than or equal to $10^7$ Ω·m and less than $10^8$ Ω·m, the pixel definition layer is formed by a polyimide material doped with an electrically conductive material, and
a volume ratio of the electrically conductive material to the polyimide material is 1:1000 to 1:20.

2. The organic electroluminescent array substrate according to claim 1, wherein the electrically conductive material is selected from a metal, an electrically conductive metal oxide, an electrically conductive polymer or any mixture thereof.

3. The organic electroluminescent array substrate according to claim 1, wherein the electrically conductive material is an electrically conductive nanomaterial.

4. The organic electroluminescent array substrate according to claim 3, wherein the electrically conductive nanomaterial is selected from an electrically conductive nanowire, an electrically conductive nanotube, an electrically conductive nanoparticle or any mixture thereof.

5. The organic electroluminescent array substrate according to claim 4, wherein the electrically conductive nanoparticle has a particle diameter equal to or less than 100 nm.

6. The organic electroluminescent array substrate according to claim 4, wherein the electrically conductive nanowire has a length equal to or less than 100 nm, and the electrically conductive nanowire has a diameter equal to or less than ½ of the length.

7. A display device, comprising an organic electroluminescent array substrate which comprises:
a pixel array, in which each pixel has a light-emitting region; and
a pixel definition layer for defining the light-emitting region of each pixel,
wherein the pixel definition layer has a volume resistivity which is higher than or equal to $10^7$ Ω·m and less than $10^8$ Ω·m,
the pixel definition layer is formed by a polyimide material doped with an electrically conductive material, and
a volume ratio of the electrically conductive material to the polyimide material is 1:1000 to 1:20.

8. The display device according to claim 7, wherein the electrically conductive material is selected from a metal, an electrically conductive metal oxide, an electrically conductive polymer or any mixture thereof.

9. The display device according to claim 7, wherein the electrically conductive material is an electrically conductive nanomaterial.

10. The display device according to claim 9, wherein the electrically conductive nanomaterial is selected from an electrically conductive nanowire, an electrically conductive nanotube, an electrically conductive nanoparticle or any mixture thereof.

11. The display device according to claim 10, wherein the electrically conductive nanoparticle has a particle diameter equal to or less than 100 nm.

12. The display device according to claim 10, wherein the electrically conductive nanowire has a length equal to or less than 100 nm, and the electrically conductive nanowire has a diameter equal to or less than ½ of the length.

* * * * *